(12) United States Patent
Zhang et al.

(10) Patent No.: US 10,073,113 B2
(45) Date of Patent: Sep. 11, 2018

(54) SILICON-BASED MEMS DEVICES INCLUDING WELLS EMBEDDED WITH HIGH DENSITY METAL

(71) Applicant: Analog Devices, Inc., Norwood, MA (US)

(72) Inventors: Xin Zhang, Acton, MA (US); Michael Judy, Ipswich, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/695,421

(22) Filed: Apr. 24, 2015

(65) Prior Publication Data

US 2016/0178656 A1 Jun. 23, 2016

Related U.S. Application Data

(60) Provisional application No. 62/095,257, filed on Dec. 22, 2014.

(51) Int. Cl.
| | |
|---|---|
| *G01P 15/08* | (2006.01) |
| *B81C 1/00* | (2006.01) |
| *H01L 21/48* | (2006.01) |
| *G01C 19/5769* | (2012.01) |

(52) U.S. Cl.
CPC ...... *G01P 15/0802* (2013.01); *B81C 1/00261* (2013.01); *G01C 19/5769* (2013.01)

(58) Field of Classification Search
CPC ............. H01L 21/4814; G01P 15/0802; B81C 1/00261

USPC .......................................................... 257/414
See application file for complete search history.

(56) References Cited

U.S. PATENT DOCUMENTS

| | | | |
|---|---|---|---|
| 4,598,585 A | 7/1986 | Boxenhorn | 73/505 |
| 4,670,092 A | 6/1987 | Motamedi | 156/643 |
| 4,869,107 A | 9/1989 | Murakami | 73/517 |
| 5,205,171 A | 4/1993 | O'Brien et al. | 73/517 B |
| 5,331,853 A | 7/1994 | Hulsing, II | 73/505 |
| 5,417,111 A | 5/1995 | Sherman et al. | 73/517 R |
| 6,230,566 B1 | 5/2001 | Lee et al. | 73/514.32 |
| 6,635,509 B1 * | 10/2003 | Ouellet | B81C 1/00333 438/106 |
| 6,651,500 B2 | 11/2003 | Stewart et al. | 73/511 |
| 6,841,992 B2 | 1/2005 | Yue et al. | 324/162 |
| 7,022,543 B2 | 4/2006 | Eskridge et al. | 438/52 |
| 7,121,141 B2 | 10/2006 | McNeil | 73/514.32 |
| 7,146,856 B2 | 12/2006 | Malametz | 73/514.32 |
| 7,210,352 B2 | 5/2007 | Foster et al. | 73/514.32 |

(Continued)

FOREIGN PATENT DOCUMENTS

| | | | |
|---|---|---|---|
| JP | 5-340956 | 12/1993 | G01P 15/12 |
| JP | 9-189716 | 7/1997 | G01P 15/125 |

(Continued)

*Primary Examiner* — Christine Enad
(74) *Attorney, Agent, or Firm* — Wolf, Greenfield & Sacks, P.C.

(57) ABSTRACT

In one aspect, the disclosure is directed to a MEMS device. The MEMS device includes a silicon-based movable MEMS sensor element. The MEMS device also includes a plurality of wells formed into at least one surface of the movable MEMS sensor element. Each well is filled with at least one metal so as to increase the effective mass of the movable MEMS sensor element. The metal may be tungsten or tantalum, or an alloy with tungsten or tantalum.

28 Claims, 18 Drawing Sheets

(56) References Cited

U.S. PATENT DOCUMENTS

| | | | |
|---|---|---|---|
| 7,367,232 B2 | 5/2008 | Vaganov et al. | 73/514.33 |
| 7,578,190 B2 | 8/2009 | Lin et al. | 73/514.29 |
| 7,610,809 B2 | 11/2009 | McNeil et al. | 73/514.32 |
| 8,020,443 B2 | 9/2011 | Lin et al. | 73/514.32 |
| 8,096,182 B2 | 1/2012 | Lin et al. | 73/514.32 |
| 8,148,790 B2* | 4/2012 | Morris | B81C 1/00333 257/415 |
| 8,171,793 B2 | 5/2012 | Foster | 73/514.32 |
| 8,186,221 B2 | 5/2012 | Lin et al. | 73/514.32 |
| 8,220,330 B2 | 7/2012 | Miller et al. | 73/514.32 |
| 8,486,198 B2 | 7/2013 | Appleyard et al. | 134/1 |
| 8,502,327 B1* | 8/2013 | Eskridge | B81B 7/007 257/415 |
| 8,919,199 B2* | 12/2014 | Judy | G01C 19/5684 73/504.12 |
| 2004/0160232 A1 | 8/2004 | Yue et al. | 324/660 |
| 2005/0268719 A1 | 12/2005 | Malametz | 73/514.32 |
| 2006/0021436 A1 | 2/2006 | Kapser et al. | 73/514.38 |
| 2006/0169043 A1 | 8/2006 | McNeil | 73/514.01 |
| 2006/0185433 A1 | 8/2006 | Leonardson et al. | 73/514.32 |
| 2006/0205106 A1* | 9/2006 | Fukuda | B81C 1/00246 438/52 |
| 2007/0000323 A1 | 1/2007 | Kuisma | 73/514.32 |
| 2008/0110260 A1 | 5/2008 | Konno et al. | 73/514.32 |
| 2009/0031809 A1 | 2/2009 | Lin et al. | 73/514.32 |
| 2009/0139331 A1 | 6/2009 | Axelrod et al. | 73/514.32 |
| 2009/0293616 A1 | 12/2009 | Lin et al. | 73/514.32 |
| 2010/0011860 A1 | 1/2010 | Offenberg et al. | 73/514.32 |
| 2010/0024552 A1 | 2/2010 | Foster | 73/514.29 |
| 2010/0103402 A1* | 4/2010 | Inoue | G03F 7/70425 355/74 |
| 2010/0107763 A1 | 5/2010 | Lin et al. | 73/514.32 |
| 2010/0122579 A1 | 5/2010 | Hsu et al. | 73/514.32 |
| 2010/0242600 A1 | 9/2010 | Lin et al. | 73/504.12 |
| 2010/0242603 A1 | 9/2010 | Miller et al. | 73/514.32 |
| 2010/0313660 A1 | 12/2010 | Nishikage et al. | 73/514.32 |
| 2011/0005319 A1 | 1/2011 | Huang | 73/514.32 |
| 2011/0013256 A1* | 1/2011 | Uchiyama | B81B 3/0008 359/290 |
| 2011/0023606 A1 | 2/2011 | Burghardt et al. | 73/514.32 |
| 2011/0056295 A1 | 3/2011 | Classen | 73/514.32 |
| 2011/0056297 A1 | 3/2011 | Classen | 73/514.32 |
| 2011/0096623 A1 | 4/2011 | Crickmore et al. | 367/13 |
| 2011/0154899 A1 | 6/2011 | Classen et al. | 73/514.32 |
| 2011/0203373 A1 | 8/2011 | Konno | 73/514.32 |
| 2011/0290023 A1 | 12/2011 | Takagi | 73/514.32 |
| 2011/0296917 A1 | 12/2011 | Reinmuth et al. | 73/514.32 |
| 2012/0043627 A1* | 2/2012 | Lin | B81B 7/02 257/415 |
| 2012/0186347 A1 | 7/2012 | McNeil | 73/514.21 |
| 2012/0216616 A1 | 8/2012 | Schultz | 73/514.38 |
| 2012/0267730 A1* | 10/2012 | Renard | B81B 7/0064 257/415 |
| 2012/0280591 A1 | 11/2012 | Schultz | 310/300 |
| 2012/0313235 A1* | 12/2012 | Chu | B81B 3/0005 257/692 |
| 2013/0167641 A1 | 7/2013 | Heller | 73/514.01 |
| 2013/0187245 A1* | 7/2013 | Chien | B81C 1/00269 257/415 |
| 2014/0054731 A1* | 2/2014 | Graham | B81B 3/0081 257/415 |
| 2014/0074418 A1 | 3/2014 | Lin et al. | 702/96 |
| 2014/0208849 A1 | 7/2014 | Zhang | 73/514.32 |
| 2014/0217929 A1 | 8/2014 | Lin et al. | 318/116 |
| 2014/0251011 A1 | 9/2014 | Zhang et al. | 73/514.32 |
| 2014/0264659 A1* | 9/2014 | Gogoi | H01L 27/14 257/416 |
| 2015/0053002 A1 | 2/2015 | Ullrich et al. | 73/514.15 |
| 2015/0096378 A1 | 4/2015 | Kigure | 73/514.32 |
| 2016/0229684 A1* | 8/2016 | Boysel | G01P 15/0802 |

FOREIGN PATENT DOCUMENTS

| | | | | |
|---|---|---|---|---|
| JP | 2004-340716 | 12/2004 | | G01P 15/125 |
| JP | 2005-529336 | 9/2005 | | G01P 15/18 |
| JP | 2008-139282 | 6/2008 | | G01P 15/125 |
| JP | 2010-210425 | 9/2010 | | G01P 15/125 |
| WO | WO 95/24652 A1 | 9/1995 | | G01P 15/08 |
| WO | WO 2008/133183 A1 | 11/2008 | | G01P 15/125 |
| WO | WO 2010/055716 A1 | 5/2010 | | G01P 15/125 |

* cited by examiner

SILICON-BASED MEMS DEVICES INCLUDING WELLS EMBEDDED WITH HIGH DENSITY METAL

RELATED APPLICATIONS

This application claims priority to U.S. Application No. 62/095,257, entitled "Silicon-Based MEMS Devices Including Wells Embedded with High Density Metal" and filed Dec. 22, 2014, which is hereby incorporated by reference in its entirety.

TECHNICAL FIELD

The present invention relates to silicon-based MEMS devices with increased inertial mass, and more particularly to MEMS devices with wells in the device layer that are filed with tungsten, tantalum, or an alloy with tungsten or tantalum.

BACKGROUND ART

Microelectromechanical systems (MEMS) devices including such things as inertial sensors (e.g., capacitive, piezoelectric, and convective accelerometers and vibratory and tuning fork gyroscopes), microphones, pressure sensors, RF devices, and optical devices (e.g., optical switches) often include a number of structures that are released so as to be movable. Examples of released structures include microphone diaphragms, inertial sensor proof masses and shuttles, and suspended encapsulation layer(s) that cap sensor structures.

MEMS devices are typically formed on a substrate (e.g., a silicon or silicon-on-insulator wafer) using various micromachining techniques such as etching into the substrate and/or depositing/patterning various materials. Structures to be released are typically formed on top of one or more "sacrificial" layers of materials that are subsequently removed to release the structure from the substrate. Typical sacrificial layers for MEMS wafer fabrication include an oxide layer. The oxide layer is typically removed using a wet or dry etch process. A wet etch process (e.g., buffered oxide etch) typically requires releasing cavities that are carefully placed and spaced to allow for wet etch access, which can impose certain constraints on product design and processes. A dry etch process (e.g., vapor HF) generally reduces the likelihood of stiction during the release process and provides more freedom in the placement and spacing of etch cavities, which in turn can lead to more flexibility in the sensor design.

SUMMARY OF CERTAIN EMBODIMENTS

In one embodiment of the invention, a MEMS device includes a silicon-based movable MEMS sensor element. The MEMS device also includes a plurality of wells formed into at least one surface of the movable MEMS sensor element. Each well is filled with at least one metal so as to increase the effective mass of the movable MEMS sensor element.

In various embodiments, the at least one metal includes tungsten, a tungsten alloy, such as tungsten and nickel. The tungsten alloy may be between about 20% and about 70% tungsten. In some embodiments, the at least one metal includes tantalum or a tantalum alloy. The tantalum alloy may be between about 20% and about 70% tantalum. Moreover, each well may be filled with at least one metal so as to increase the effective mass of the movable MEMS sensor element between about 2.5 and about 7.0. In some embodiments, the plurality of wells covers between about 20% and about 82% of the surface of the silicon wafer.

In some embodiments, each well has an XY plane view shaped like a clover. A length of an edge in the clover may be about 6.4 µm, and each well may be separated from adjacent wells by about 2.0 µm.

In some embodiments, each well has an XY plane view shaped like a square. Each well may have a length of about 10.0 µm and a width of about 10.0 µm. Additionally, each well may be separated from adjacent wells by about 2.0 µm. Alternatively, each well may have a length of about 2.0 µm and a width of about 2.0 µm, and also be separated from adjacent wells by about 2.0 µm.

In some embodiments, each well has an XY plane view shaped like a rectangle. Each well may have a length of about 20.0 µm and a width of about 2.0 µm. Further, each well may be separated from adjacent wells by about 6.0 µm.

In some embodiments, each well has an XY plane view shaped like a circle. Each well may have a diameter between about 2.0 µm and about 10.0 µm. Further, each well may be separated from adjacent wells by about 2.0 µm.

The movable MEMS sensor element may be a proof mass of a MEMS accelerometer. In some embodiments, the movable MEMS sensor element may be a resonator mass of a MEMS gyroscope. Furthermore, the wells may extend only partially through the MEMS sensor element or completely through the MEMS sensor element. Additionally, the wells may be partially filled with the at least one metal, or completely filled with the at least one metal.

In another aspect, the disclosure is directed to a method of fabricating a MEMS device. The method includes forming a movable MEMS sensor element. The method also includes forming a plurality of wells into at least one surface of the movable MEMS sensor element. The method additionally includes filling the wells with at least one metal so as to increase the effective mass of the movable MEMS sensor element.

Forming the plurality of wells may include patterning a plurality of shapes on the at least one surface of the movable MEMS sensor element, and etching the at least one surface of the movable MEMS sensor element to form the plurality of wells from the plurality of shapes. Further, patterning the plurality of shapes may include patterning a plurality of clovers, a plurality of squares, a plurality of rectangles, or a plurality of circles, although the present invention is not limited to such shapes.

BRIEF DESCRIPTION OF THE DRAWINGS

The foregoing features of embodiments will be more readily understood by reference to the following detailed description, taken with reference to the accompanying drawings, in which.

DETAILED DESCRIPTION OF SPECIFIC EMBODIMENTS

Definitions

Figure 1:
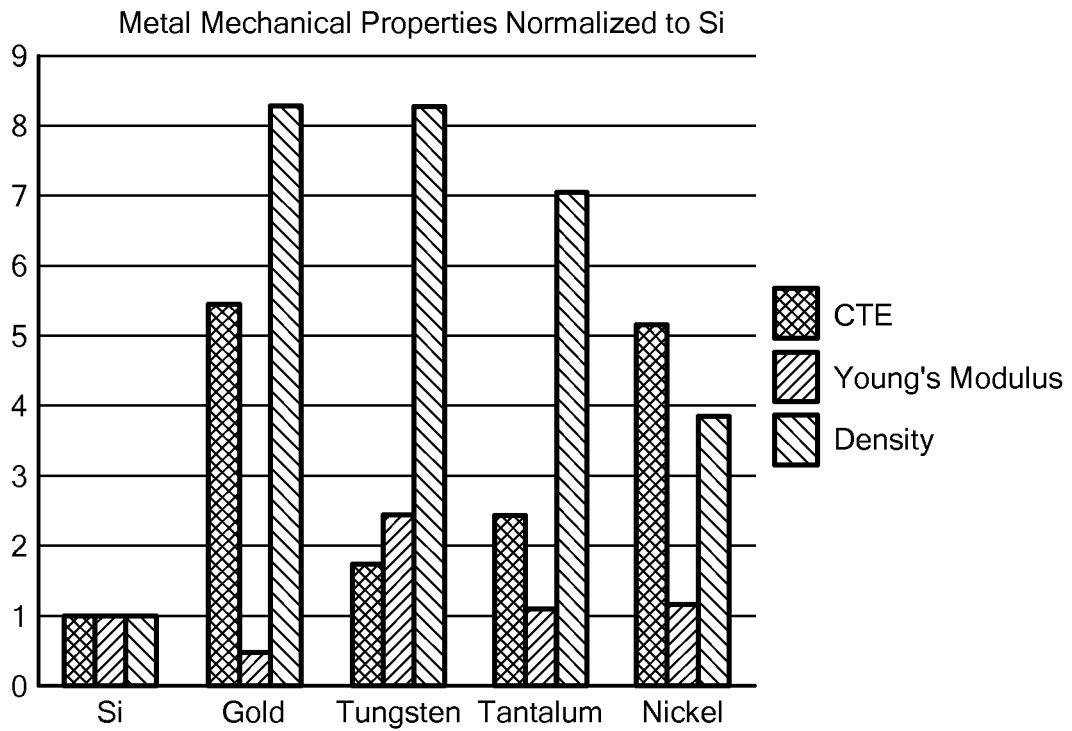
FIG. 1 graphically depicts the characteristics of silicon and silicon-compatible materials.

As used in this description and the accompanying claims, the following terms shall have the meanings indicated, unless the context otherwise requires:

A "well" is a cavity formed (e.g., etched) into a surface of a MEMS sensor element. In many embodiments, a well does not extend all the way through the MEMS sensor element, although in certain embodiments, a well may extend all the way through the MEMS sensor element.

A well is "filled" with a material by being at least partially filled with the material. The filled well may be flush with the surface of the MEMS sensor element, may dip below the surface of the MEMS sensor element, may extend slightly above the surface of the MEMS sensor element, or may have internal voids (e.g., cavities).

A "silicon-based" MEMS sensor element is formed primarily from silicon or polysilicon.

A "movable" MEMS sensor element is a MEMS sensor element that is designed to move. Typically, the movable MEMS sensor element is anchored or otherwise supported so that it does not move while the wells are formed and filled with at least one metal. Later, the movable MEMS sensor element is "released" so that it becomes free to move. A movable MEMS sensor element may take any of a wide variety of forms depending on the type of MEMS device. For example, the movable MEMS sensor element may be a proof mass in a MEMS accelerometer or in a MEMS gyroscope.

Increasing the mass of a MEMS sensor element improves its performance because the resulting element exhibits a stronger output signal. Moreover, sensors with higher mass experience less noise, such as Brownian noise, and have greater insensitivity to stress (e.g., the sensors have higher stability in offset). These MEMS sensor elements are desirable for applications that require ultra-low noise and offsets, such as seismic or geo-sensing applications and high-end industrial applications. For some applications, sensor elements may need to exhibit noise levels on the order of, or less than, 1 μg/rtHz to produce accurate and useful measurements.

Three conventional ways of increasing sensor mass are increasing the thickness of layers in the MEMS sensor elements, increasing the size of the die, and depositing substances on top of the MEMS sensor elements. However, these approaches have significant drawbacks. Thicker layers of silicon and polysilicon are more prone to fabrication errors. Etching agents inevitably disperse from their originally deposited locations, and because forming features in thicker layers requires exposure to these chemicals for longer periods of time, the walls for the features are more likely to have sloped edges. As a result, the features are less precise and accurate. Moreover, the larger sensing gaps for thicker walls produce less sensitive MEMS sensor elements.

The second approach, fabricating a larger die, increases the cost of production. Moreover, since a larger MEMS sensor element is more sensitive to stress, the device may have greater sensitivity to stress and larger offset than its smaller counterparts. The last approach, depositing substances on top of the MEMS sensor elements, increases the thickness of the device so that the device experiences greater stress, and this stress would create unwanted and temperature-dependent curvature for the proof mass and deteriorate the device's offset performance. Moreover, the additional layer(s) may change the position of the device's center of mass. Since the layer(s) may cause the center of mass to lie above the plane of the MEMS sensor element, the center of mass may be misaligned with surrounding elements, such as springs. When such misalignment is present, an X axis acceleration could cause an out-of-plane tilting of the proof mass and cause motion in the Y or Z axis. This cross-axis problem may impact the device's performance.

It is also recognized that MEMS sensor elements may be fabricated entirely from tungsten or tungsten alloys, e.g., the entire device layer of a MEMS device may be tungsten rather than silicon or polysilicon. It is also recognized that if tungsten mechanical structures could be incorporated into electronics in a way similar to that taught by Sherman et al. in U.S. Pat. No. 5,417,111, then the cost and accuracy of the devices would be substantially improved. The cost for a given level of performance could be reduced by reducing the mechanical structure size or the accuracy enhanced in a given size by exploiting the greater inertial signal from tungsten.

The properties of tungsten metal account for these features. First, like silicon, tungsten is a brittle material at normal temperatures (i.e., in the sense of not being plastic). It does not assume a permanent deformation when strained to an extent less than breaking. Thus, tungsten forms moving structures with stable geometry and stiffness. Second, tungsten has a density 8.3 times that of silicon. As a result, a tungsten structure would experience about eight times the inertial force compared with a similar size silicon structure, whereas a tungsten structure might be expected to get more nearly the same perturbing forces from non-inertial sources such as Brownian motion of the surrounding medium (or alternatively a tungsten structure can be approximately one-eighth the size of a silicon structure to experience the same inertial force, e.g., 4 μm thickness of tungsten is approximately the same mass as 33 μm thickness of silicon). Thus, tungsten would yield a much improved signal to noise ratio (SNR). Third, tungsten has 2.5 times greater Young's modulus than silicon. Greater structural stiffness can be obtained from a given size, making it less susceptible to perturbation. Fourth, the absolute strengths of tungsten microstructures are comparable with those of silicon. Strength is a critical parameter in designing moving structures. Fifth, unlike silicon, tungsten has electrically conductive oxides. Silicon naturally forms an insulating surface oxide which, to a varying extent over temperature, time and environmental factors, traps electrical charge. This destabilizes micromachined gyroscope and accelerometer null bias, generally the most important measure of inertial instrument accuracy. It has been found that coating active surfaces of silicon sensors with a conductor vastly improves their stability, as taught by O'Brien et al. in U.S. Pat. No. 5,205,171. Although it may, like silicon, absorb foreign species on the surface, tungsten is free of the dominant charging effect.

Others have recognized the use of tungsten in MEMS devices would have certain advantages, particularly as a substitute for silicon. For example, U.S. Pat. No. 7,367,232 and U.S. Patent Publication Nos. US 2011/0005319 and US 2011/0096623 mention tungsten as a possible material for various MEMS structures.

However, fabricating MEMS sensor elements from solid tungsten is difficult because the use of traditional fabrication processes tends to produce tungsten MEMS structures with high internal stresses such that the tungsten MEMS structures tend to warp or bend when released, resulting in devices that are unusable or have low performance. Moreover, because etching in tungsten is less precise than etching in silicon, beam gaps and sidewall angles in tungsten MEMS sensor elements will exhibit greater variation than in silicon. The imperfections would tend to degrade device matching and offset performance in a solid tungsten sensor.

The inventors have discovered that depositing heavier substances such as tungsten or tungsten alloy in wells formed inside a silicon-based MEMS sensor element increases its mass without incurring the deficiencies of conventional methods. Advantageously, because the wells are isolated from other elements, any stress induced by the wells remains local. Moreover, the wells do not induce stress on the proof mass of the MEMS sensor element. Furthermore, because the sensor elements still use silicon for features such as springs and capacitors, the elements can be fabricated with high precision micro machining, with high yield.

Tungsten may be deposited in these wells, although other silicon-compatible materials, such as tantalum, additionally or alternatively may be used. Moreover, the wells may be etched into the MEMS sensor element in a variety of configurations, such as a staggered clover pattern, a grid of squares, a grid of rectangles, or a grid of circles. Depending on the substance and the configuration of the wells, the filled wells may increase the mass of the MEMS sensor element between about 2.5× and about 7.0×. When the effective mass of the inertial sensor is increased by a factor of K, and all other conditions (e.g., stiffness, sensor geometry, cavity gas pressure) are unchanged, the output signal would increase by a factor of K and the Brownian noise would decrease by a factor of K. In this manner, the signal to noise ratio (SNR) of the MEMS sensor elements would increase by a factor of $K^2$, improving the performance greatly.

FIG. 1 graphically depicts the characteristics of silicon and silicon-compatible materials. In particular, the graph reveals tungsten's superiority over other candidate materials for embedding into silicon-based MEMS sensor elements. The graph depicts each material's coefficient of thermal expansion, Young's modulus, and density, relative to silicon. The coefficient of thermal expansion (also referred to herein as "CTE") indicates the extent that the material expands or contracts, based on temperature. When wells are filled with materials having comparable CTEs to silicon, the wells experience less thermomechanical stress. The Young's modulus indicates the stiffness of the material. Since deformation of the wells is undesirable, materials with higher Young's modulus are more desirable. Lastly, the density indicates the mass per unit volume of the material. Since the present solution seeks to increase the mass of the device, denser materials are more desirable.

As the graph demonstrates, tungsten is an exceptionally suitable material for filling wells formed in a surface of a MEMS sensor element. At 19.3 g/cm³, tungsten has a density that is 8.3 times that of silicon. As a result, tungsten would experience an inertial force that is about eight times greater than that of silicon or polysilicon. Its greater mass would experience fewer perturbing forces from non-inertial sources, such as Brownian motion of the surrounding medium. Moreover, tungsten has a greater density than tantalum and nickel.

Further, at about 400 GPa, tungsten has a Young's modulus that is 2.5 times greater the Young's modulus of silicon. As a result, tungsten is less susceptible to perturbation than silicon and thus is more stable. Lastly, among the materials depicted in FIG. 1, tungsten has a CTE that is best matched to silicon's: 4.5 µm/(m° C.), compared to 2.6 µm/(m° C.). Thus, while tungsten may expand or contract with temperature more than silicon, tungsten still achieves better performance than other candidate materials.

Tantalum is also a suitable material for filling the wells. At 16.69 g/cm3, tantalum has a density that is about 7.2 times that of silicon and would experience an inertial force that is about 7.2 times greater than that of silicon or polysilicon. At about 186 GPa, tantalum has a Young's modulus that is about 1.16 times greater the Young's modulus of silicon, making tantalum more stable. Furthermore, tantalum has a CTE of about 6.3 µm/(m° C.), which is still more comparable to the CTE of silicon than gold or nickel. For similar reasons that tungsten is a suitable material for filling the wells, tantalum also exhibits properties that match the materials to the objectives of this disclosure.

FIG. 1 also demonstrates the relative shortcomings of other potential materials for filling the wells. For example, the relatively small Young's modulus and relatively high CTE of gold demonstrates why gold is a less advantageous material than tungsten, even though the two materials have comparable density. Since gold has an even smaller Young's modulus than silicon, wells filled with gold would be more susceptible to perturbation than their surrounding silicon walls. For example, the gold in the wells would relax and yield to stresses acting on the silicon. As a result, over time, the gold would drift. Since MEMS sensor elements may be used in applications requiring high reliability (e.g., roughly 10 years of performance), gold's characteristics may render MEMS sensor elements too unstable for the applications' needs.

Similarly, nickel exhibits some of the same shortcomings as gold, while exhibiting less density than tungsten or tantalum. As a result, nickel fails to increase the mass of the MEMS sensor elements as well as tungsten or tantalum, and the materials also have inferior performance in other respects.

While wells may be filled with pure tungsten or tantalum, in various embodiments, wells may be filled with tungsten or tantalum alloys. For example, since tungsten may be susceptible to etching chemicals, using a tungsten alloy may preserve the integrity of the wells during the fabrication process. For example, filling the wells with an alloy of tungsten and nickel may increase mass, while keeping the wells in tact during subsequent etching procedures. In various embodiments, the tungsten content of an alloy may be between about 20% and about 70%. Because tungsten is denser than nickel, alloys with higher concentrations of tungsten are more desirable. Likewise, tantalum alloys may also be used. Although tungsten and tantalum are two exemplary materials suitable for filling the wells, any material with comparable characteristics may be used.

Figure 2:
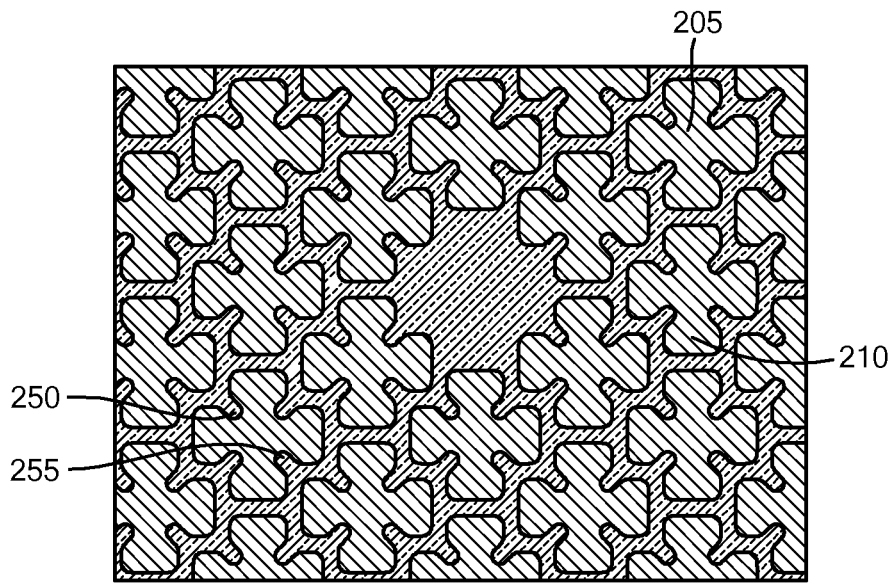
FIG. 2 shows an XY plane view of a MEMS sensor element depicting a close-up of wells shaped like clovers.

FIGS. 2-5 depict different patterns of wells that may be formed on a surface of a silicon-based MEMS sensor element. FIG. 2 depicts a close-up of wells 205, 210 with XY plane views shaped like clovers (also referred to as "clover-shaped wells"). In these embodiments, the pattern of clover-shaped wells covers about 70% of the surface of the MEMS sensor element, and when the wells are filled with tungsten, the tungsten increases the mass of the sensor element by about 6.0×. The length of each edge of a single clover is about 6.4 μm, and each edge of the well is spaced at least 2.0 μm from the nearest edge of the adjacent wells.

The clover shape enables each well to be more evenly filled during the fabrication process. In general, wells are filled by having each exposed surface covered with one or more substances until the layers of the substance converge with one another. As a result, the area between distant edges, such as the edge defined by positions 250 and 255 in FIG. 2, may still be underfilled when the rest of the well has been filled. The clover shape depicted in FIG. 2 has been designed to minimize the distances between all edges within the shape while maximizing its total surface area. As a result, wells formed according to the pattern in FIG. 2 will be more evenly filled, compared to wells deposited in alternative configurations.

Figure 3:
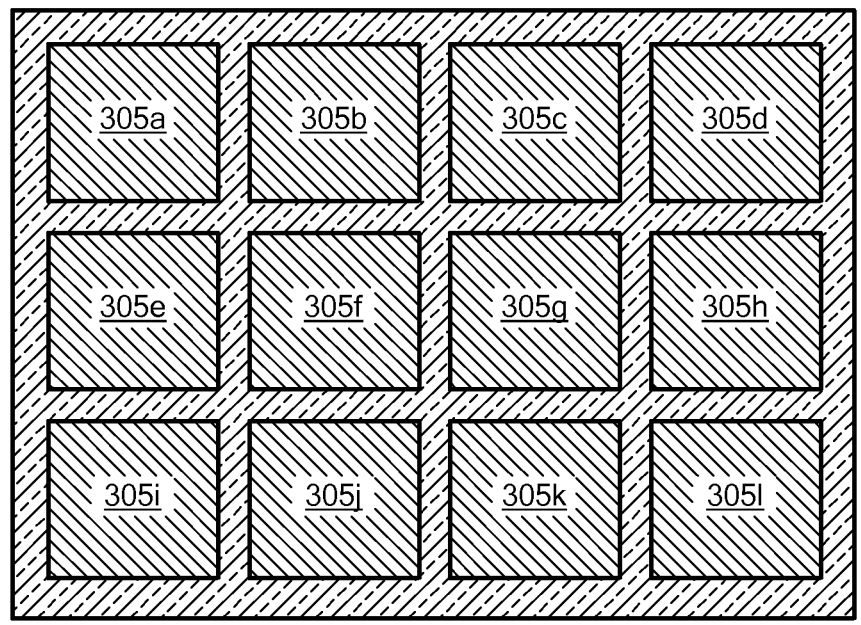
FIG. 3 shows an XY plane view of a MEMS sensor element depicting a pattern of square-shaped wells dispersed over the surface of the MEMS sensor element.
Figure 4:
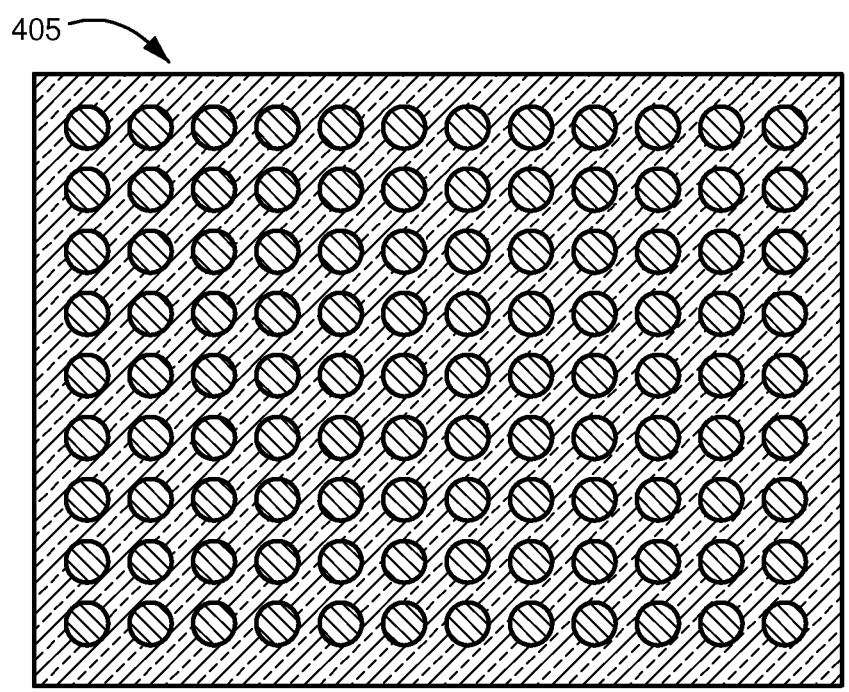
FIG. 4 shows an XY plane view of a MEMS sensor element depicting a pattern of circular-shaped wells dispersed over the surface of the MEMS sensor element.
Figure 5:
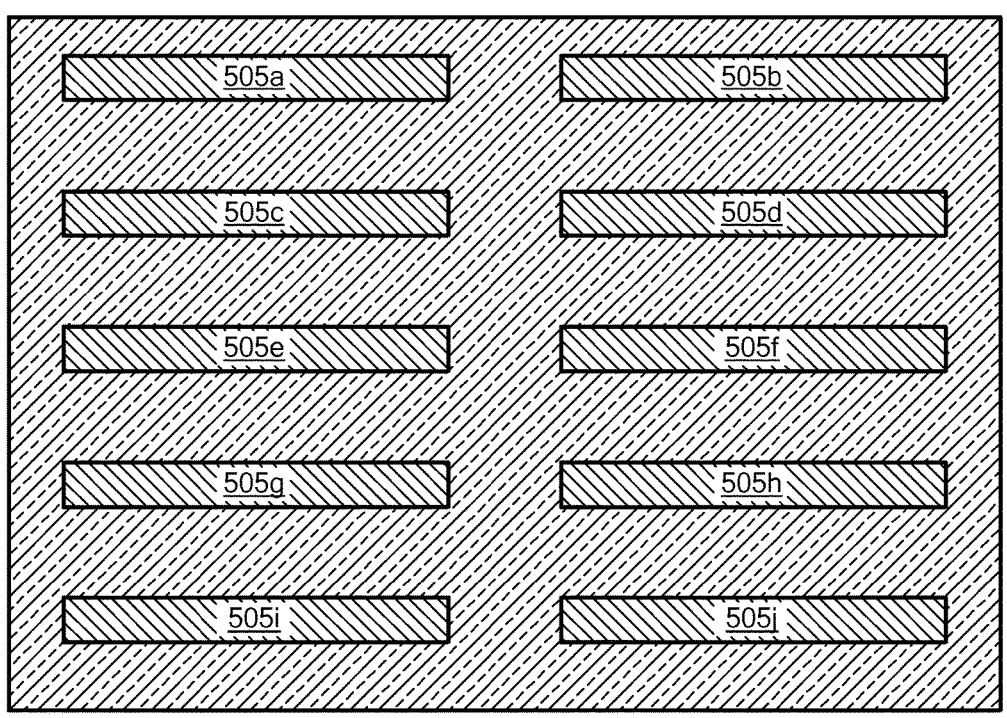
FIG. 5 shows an XY plane view of a MEMS sensor element depicting a pattern of rectangle-shaped wells dispersed over the surface of the MEMS sensor element.

FIGS. 3-5 depict patterns of wells with XY plane views shaped like squares or rectangles, which may be dispersed over the surface of a MEMS sensor element.

In FIG. 3, the wells 305 have XY plane views shaped like squares. In one specific exemplary embodiment of FIG. 3, the pattern of wells would cover about 82% of the surface of the MEMS sensor element. The length of each edge of the square is about 10.0 μm, and each edge of the well is spaced at least 2.0 μm from the nearest edge of the adjacent wells.

In theory, when the wells are filled with tungsten, the tungsten would increase the mass of the sensor element by about 7.0×. However, in practice, the wells would be difficult to fill evenly. In particular, the edge connecting opposite corners of a well, which would be 14.14 μm long, would be under filled compared to the rest of the well. Therefore, tungsten embedded according to this pattern would increase the mass by less than 7.0×, and possibly less than the pattern depicted in FIG. 2.

In another specific exemplary embodiment of FIG. 3, the pattern of wells 305 would cover about 45% of the surface of the MEMS sensor element. The length of each edge of the square is about 2.0 μm, and each edge of the well is spaced at least 2.0 μm from the nearest edge of the adjacent wells.

In theory, when such wells are filled with tungsten, the tungsten would increase the mass of the sensor element by about 4.3×. For the same reasons discussed above, the wells may not fill evenly in practice and the mass may be increased by less than 4.3×. However, for this pattern, the smaller dimensions of the squares reduce the likelihood of uneven filling.

In FIG. 4, the wells 405 have XY plane views shaped like circles. In this manner, each well 405 formed in the surface of the MEMS sensor element would have a cylindrical shape. The diameter of a well may be between about 2.0 μm and about 10.0 μm. Additionally, each well may be separated from adjacent wells by about 2.0 μm. In some embodiments, the wells have may the same dimensions, although in other embodiments, the wells may have different diameters and/or depths.

FIG. 5 depicts a pattern in which the wells 505a, 505b, 505c (collectively "505") have XY plane views shaped like rectangles. In these embodiments, the pattern of wells covers about 20% of the surface of the MEMS sensor element. The length of one dimension of the rectangle is about 2.0 μm, while the length of the other dimension is about 20.0 μm. Each edge of the well is spaced at least 6.0 μm from the nearest edge of the adjacent wells. In theory, when the wells are filled with tungsten, the tungsten would increase the mass of the sensor element by about 2.5×. For the same reasons discussed with respect to FIG. 3, the wells may not fill evenly in practice and the mass may be increased by less than 2.5×. However, because opposite edges of the rectangles are only spaced 2.0 μm apart, this smaller dimension reduces the likelihood of uneven filling compared to the pattern of FIG. 3.

Figure 6:
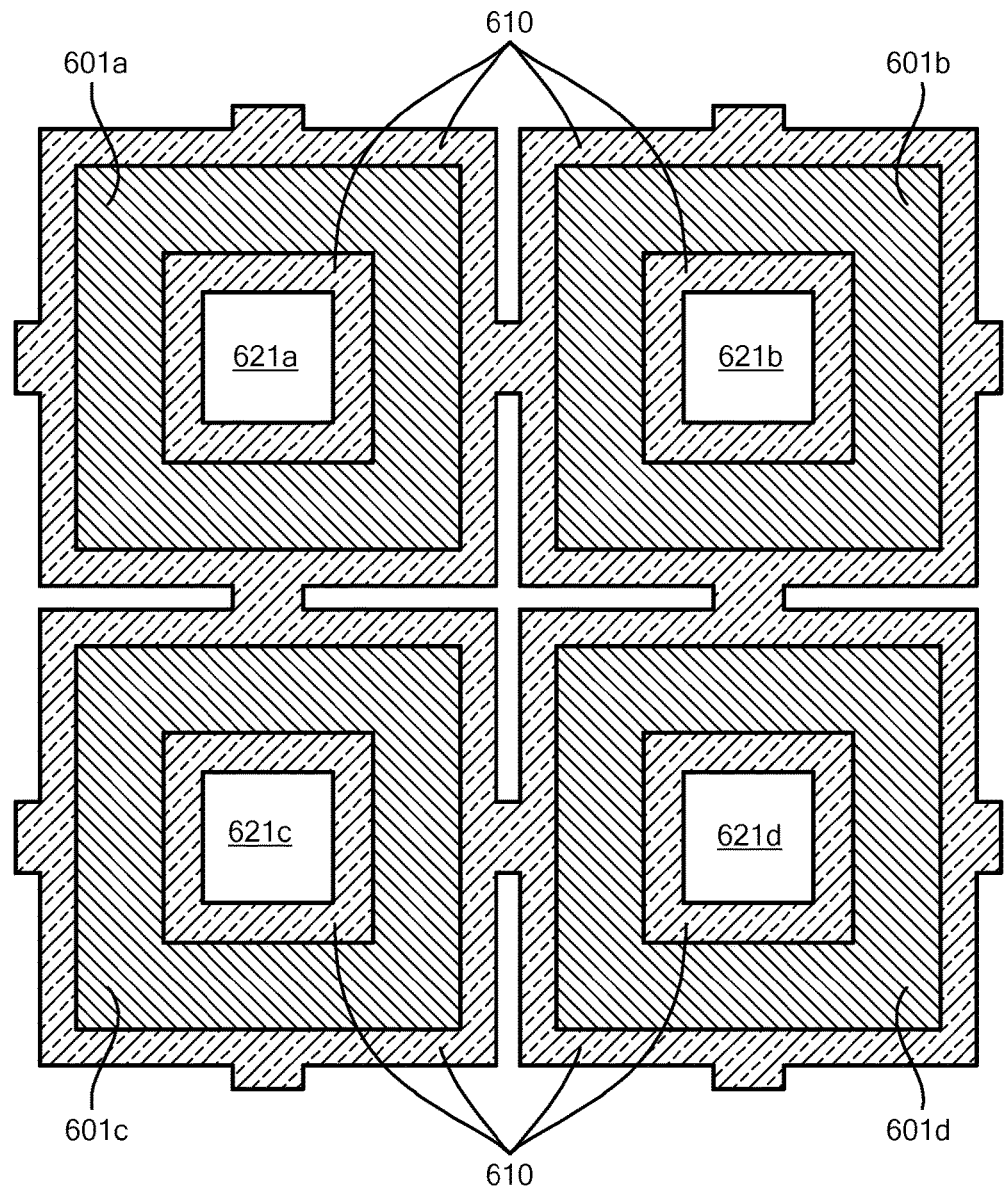
FIGS. 6-7 show XY plane views of MEMS sensor elements depicting patterns of wells with hollow centers dispersed over the surface of the MEMS sensor element.
Figure 7:
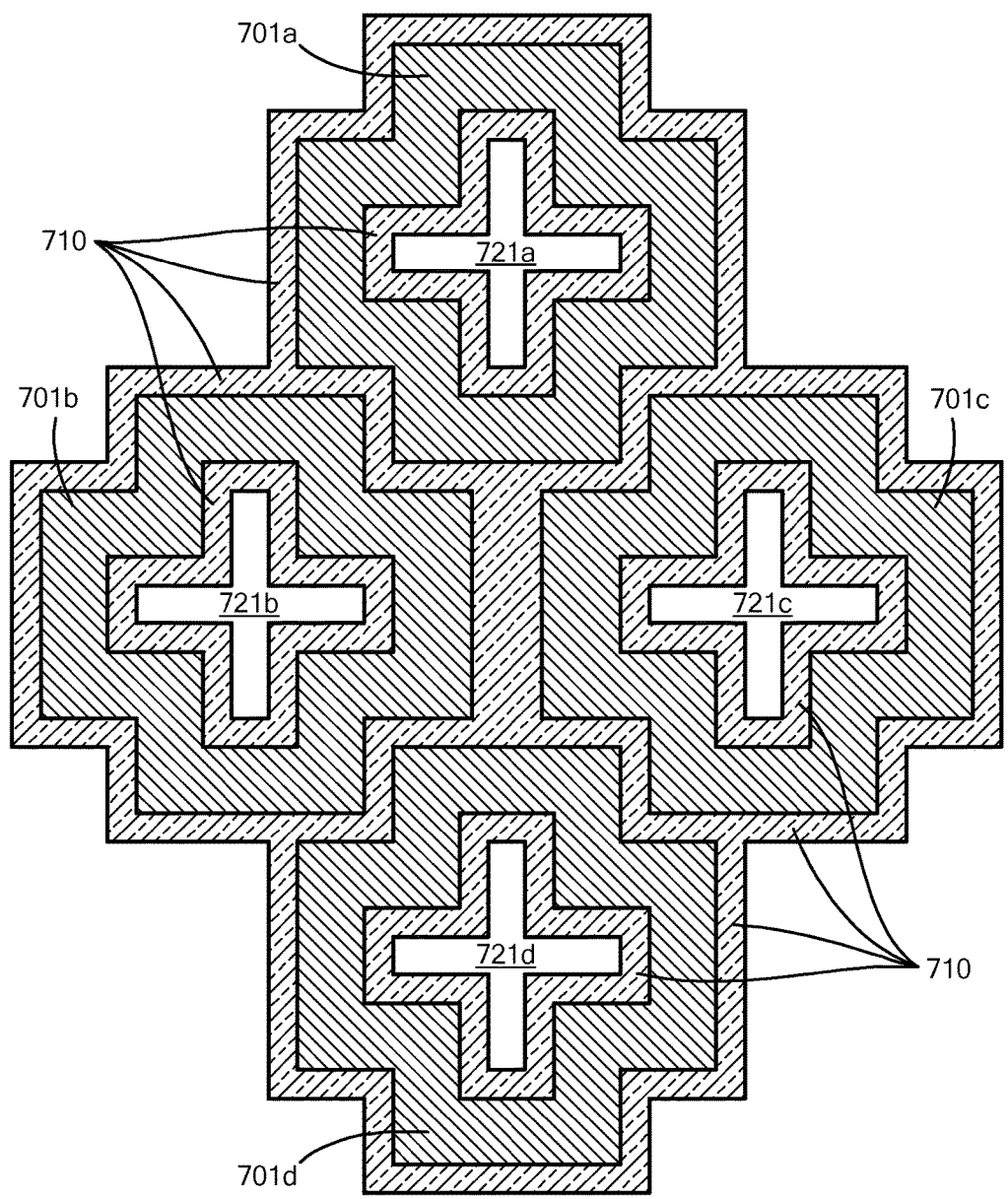

FIGS. 6-7 depict patterns of wells dispersed over the surface of a MEMS sensor element, wherein each well includes a hollow center. In FIG. 6, the XY plane views of the wells 601a, 601b, 601c, 601d (collectively, "601") are hollow squares. The wells 601 are surrounded by silicon 610 along both their exterior and interior perimeters. In these embodiments, material from the silicon 610 lining the interior perimeters of the wells 601 has been etched away, leaving holes 621a, 621b, 621c, 621d (collectively, "621"). These holes may relieve stresses on the devices. Moreover, the holes 621 may act as etch holes to facilitate the proof mass release from the sacrificial oxide underneath.

Similarly, FIG. 7 depict wells 701a, 701b, 701c, 701d (collectively, "701") whose shapes have hollow interiors. The XY plane views of the wells 701 are hollow crosses, and the wells 701 are surrounded by silicon 710 along both their exterior and interior perimeters. Again, material from the silicon 710 lining the interior perimeters of the wells 701 has been etched away, leaving empty trenches 721a, 721b, 721c, 721d (collectively, "721"), which relieve stress, in the interiors of the wells. Moreover, the holes 721 may act as etch holes to facilitate the proof mass release from the sacrificial oxide underneath.

In these two embodiments, the perimeters of the holes have the same configuration as the exterior perimeter of the wells. Any other shape for the wells and their interior holes may be used, and in some embodiments, the interior holes assume different shapes compared to the wells.

The wells may be fabricated and filled according to various methods of creating features in the surfaces of silicon-based MEMS sensor elements. One exemplary method of creating the wells is depicted in FIGS. 8-15. However, other methods may be used, as desired by one of ordinary skill in the art.

Figure 8:
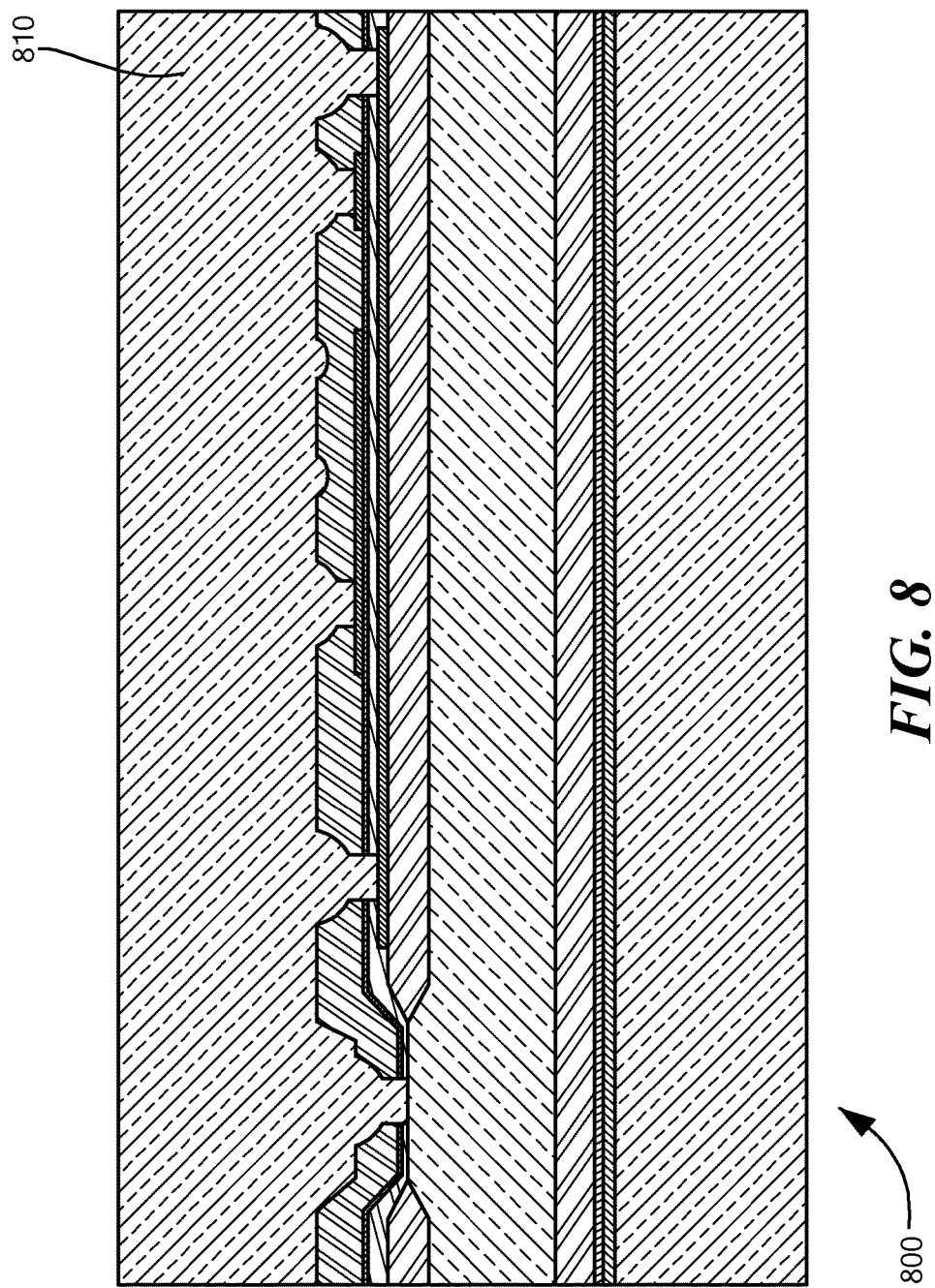
FIGS. 8-20 depict an exemplary sequence of steps for fabricating the wells embedded with a substance, in the surface of a MEMS sensor element.
Figure 9:
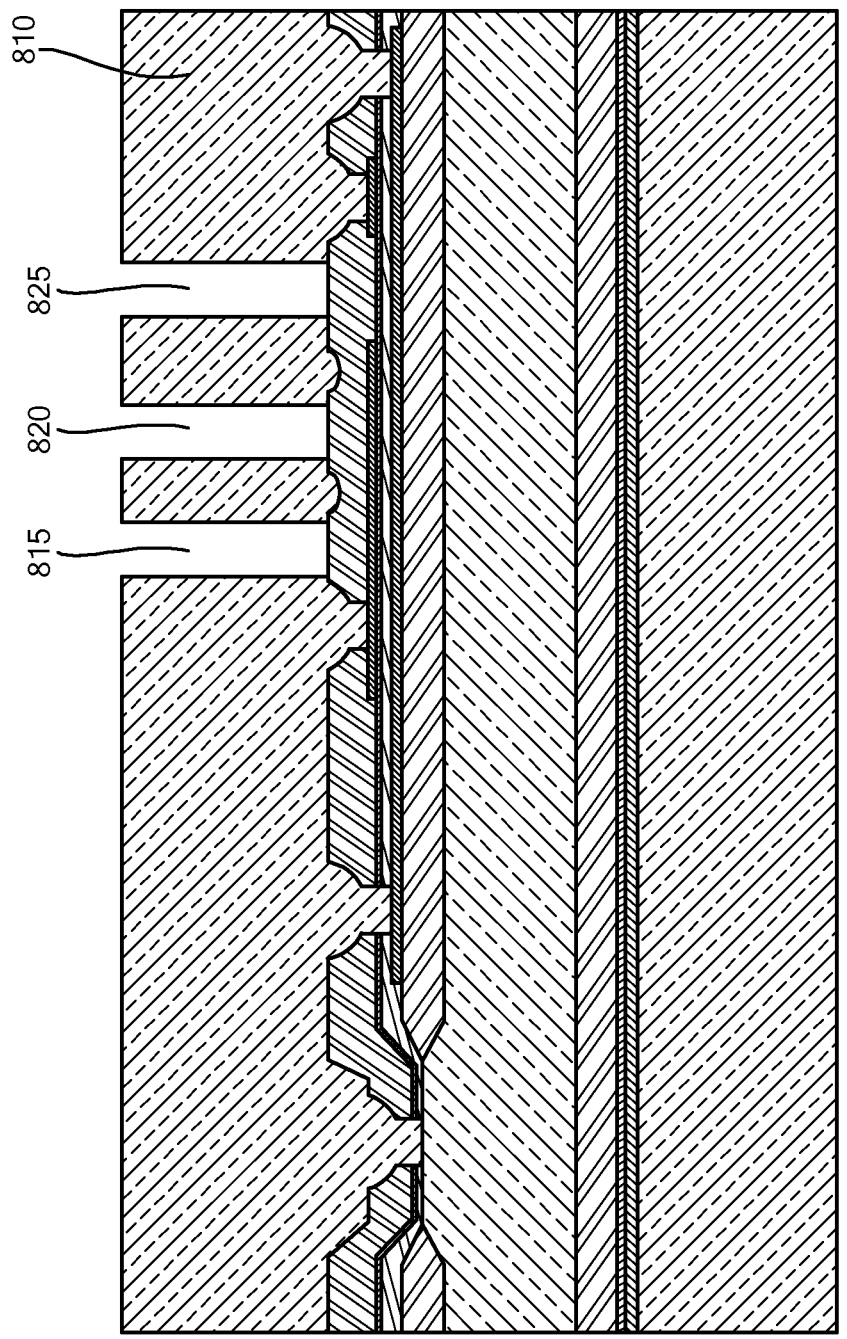

FIG. 8 depicts an exemplary MEMS sensor element 800 prior to the creation of wells. In this embodiment, the sensor element 800 has a top layer 810 of silicon, which may have a variable thickness as a result of prior processes for fabricating features in the die. For example, the layer 810 may fluctuate between 8.0 μm, 16.0 μm, and 50.0 μm throughout the surface of the die.

To create the wells, cavities 815, 820, 825 may be etched in the silicon layer 810. In the embodiment depicted in FIG. 9, the cavities 815, 820, 825 are positioned in areas of the substrate 910 that will not be used to form additional features for the MEMS sensor element 800. However, the cavities 815, 820, 825 may be positioned according to any of the patterns described in FIGS. 2-5, or any variation thereof. Although deep reactive-ion etching (DRIE) may be used for the etching, other types of etching may also be used.

Various methods may be used to fill the wells 815, 820, 825 with one or more substances 1010. For example, tungsten may be inserted in the wells 815, 820, 825 via chemical vapor deposition or electroplating. In another example, tungsten 1010 may be sputtered at a temperature less than about 500° C. (e.g., between around 400° C. and 500° C.), along with careful control of oxygen levels during sputtering. In this manner, the wells 815, 820, 825 may be filled without raising the temperature of the substrate material 810 above around 450° C., which is generally about the highest temperature that modern electronics can reach without damage, with smaller parts such as transistors generally more susceptible to damage. Another exemplary method of depositing tungsten 1010, or any other substance, in the wells 815, 820, 825 is electroplating, which generally will require an additional pre-deposited metal seed layer for conduction.

Figure 10:
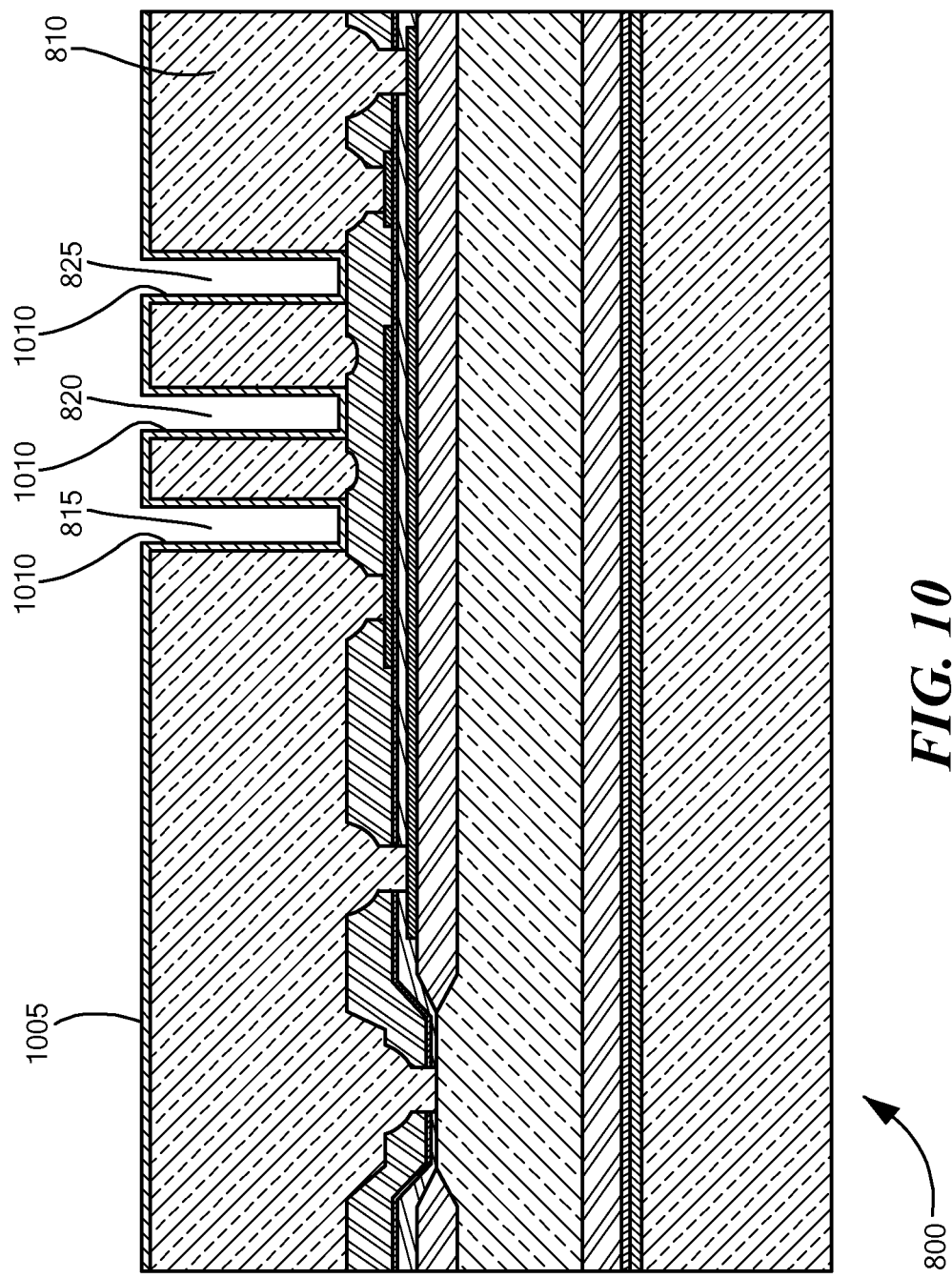

Methods of depositing substances generally coat each exposed surface with a layer of the substance(s). As a result, both the surfaces of the wells 815, 820, 825 and the surface of the silicon layer 810 are covered in the substance(s), as depicted in FIG. 10. As discussed above, the additional layer 1005 on the silicon layer 810 adds stress to the sensor element 800, creating unwanted and temperature-dependent curvature for the proof mass. Further, the stress also shifts the sensor element's center of mass. Thus, the extraneous layers of substance 1005 (also referred to herein as "surface substance(s)") need to be removed from the silicon layer 810. FIGS. 11-15 depict a sequence of processes that fill the wells 815, 820, 825 while maintaining the surface of the silicon layer 810 free of additional substances 1005. In these figures, the wells 815, 820, 825 are incrementally filled with the substance(s) 1010, and after each deposition, the surface substance 1005, 1005', 1005" is removed from the silicon layer 810. Although repeatedly removing thin layers of the surface substance 1005 is more reliably controllable than removing single, thicker layers of the material, the latter technique may also be performed, if desired.

Figure 11:
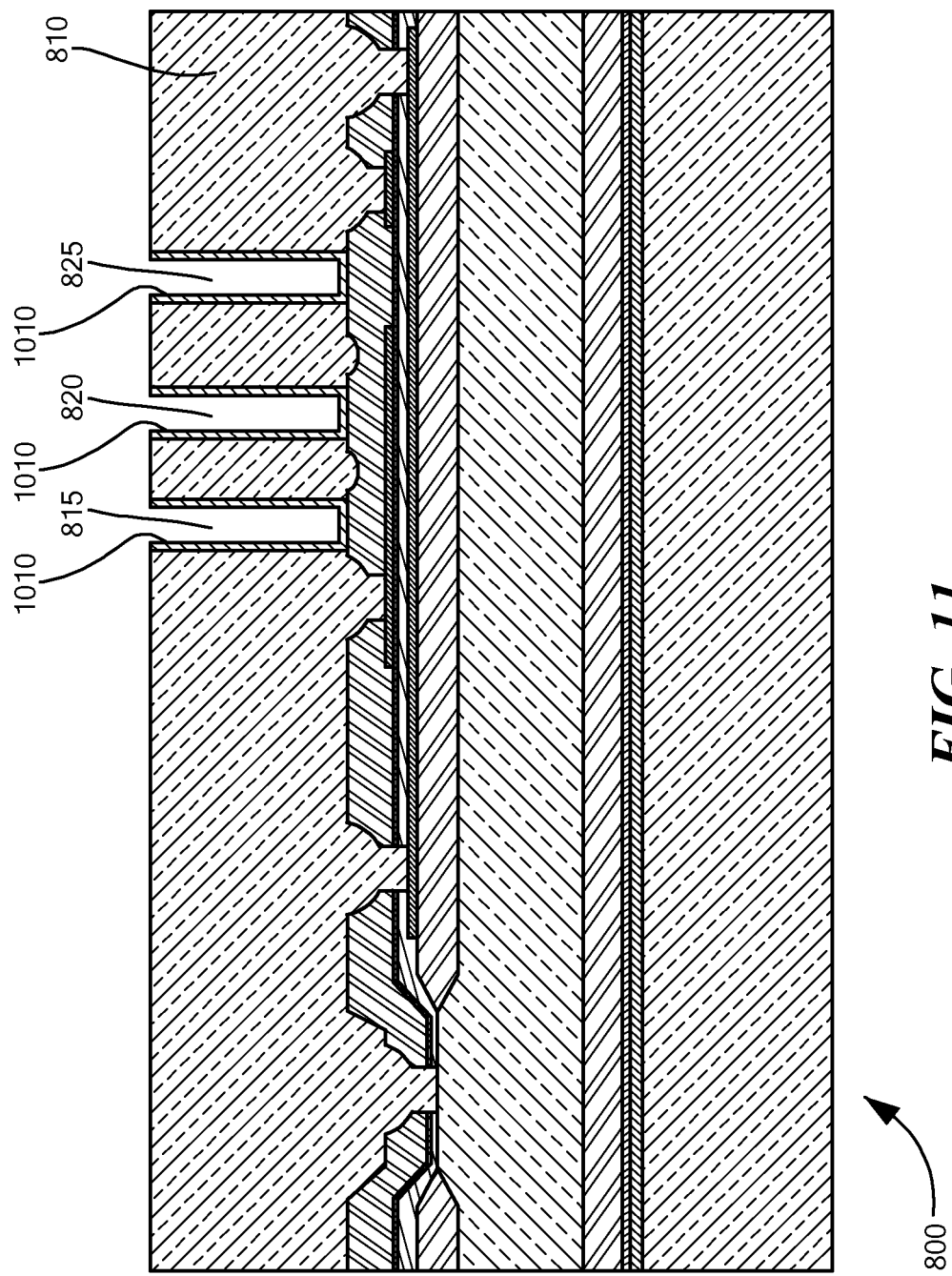

In FIG. 11, only the surface substance 1005 is removed, while the substance 1010 in the wells 815, 820, 825 is preserved. In some embodiments, anisotropic etching removes the surface substance 1005.

Figure 12:
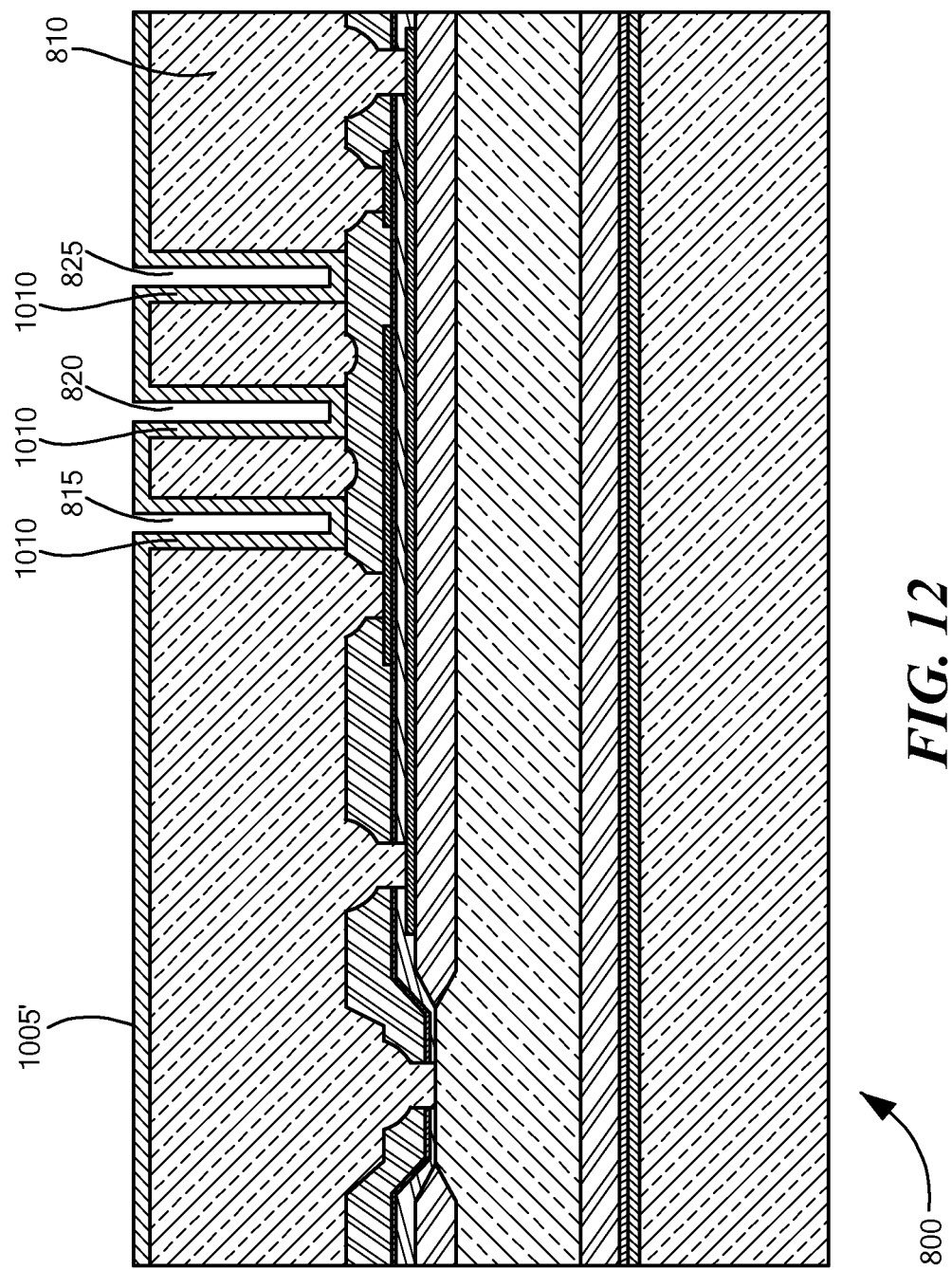
Figure 13:
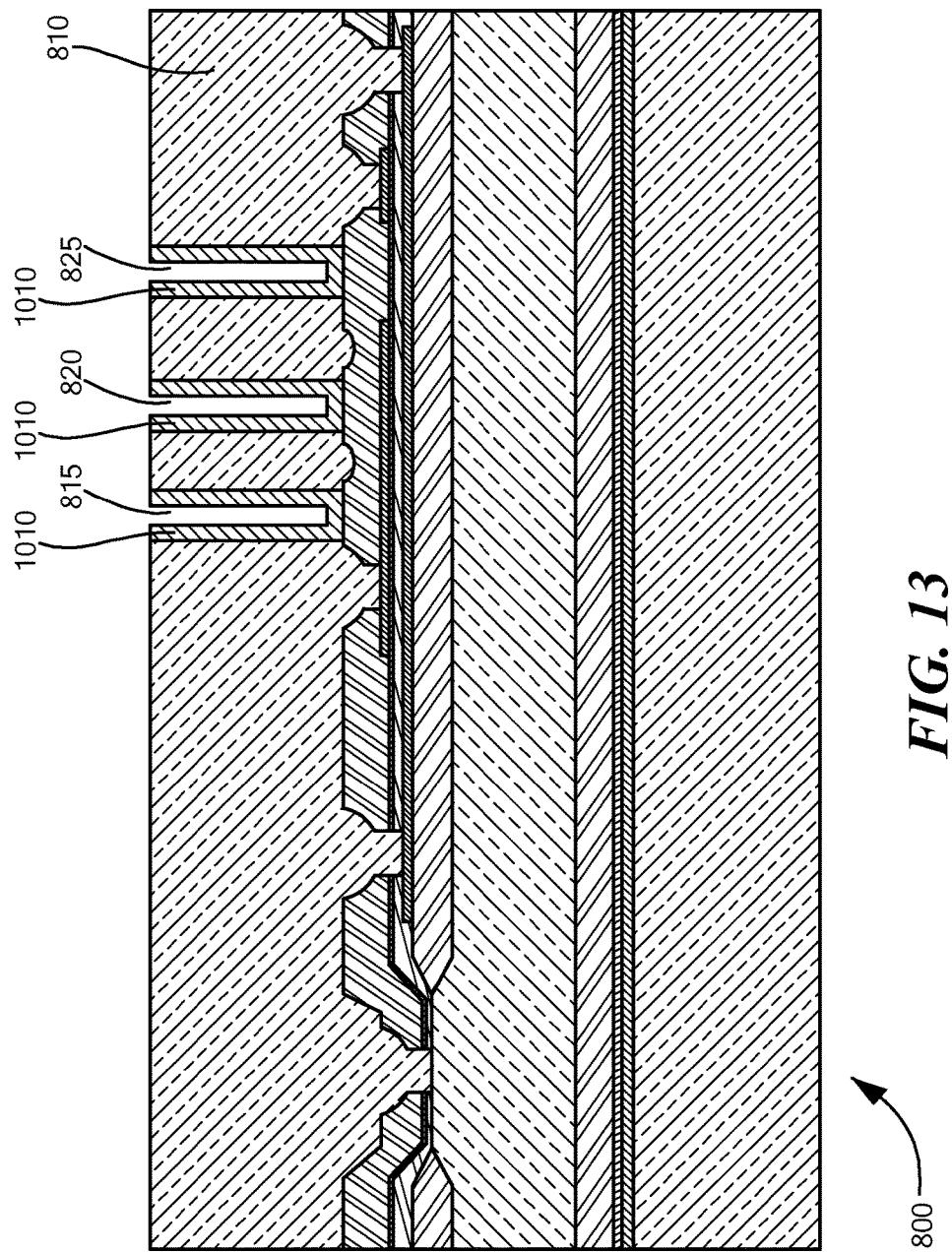
Figure 14:
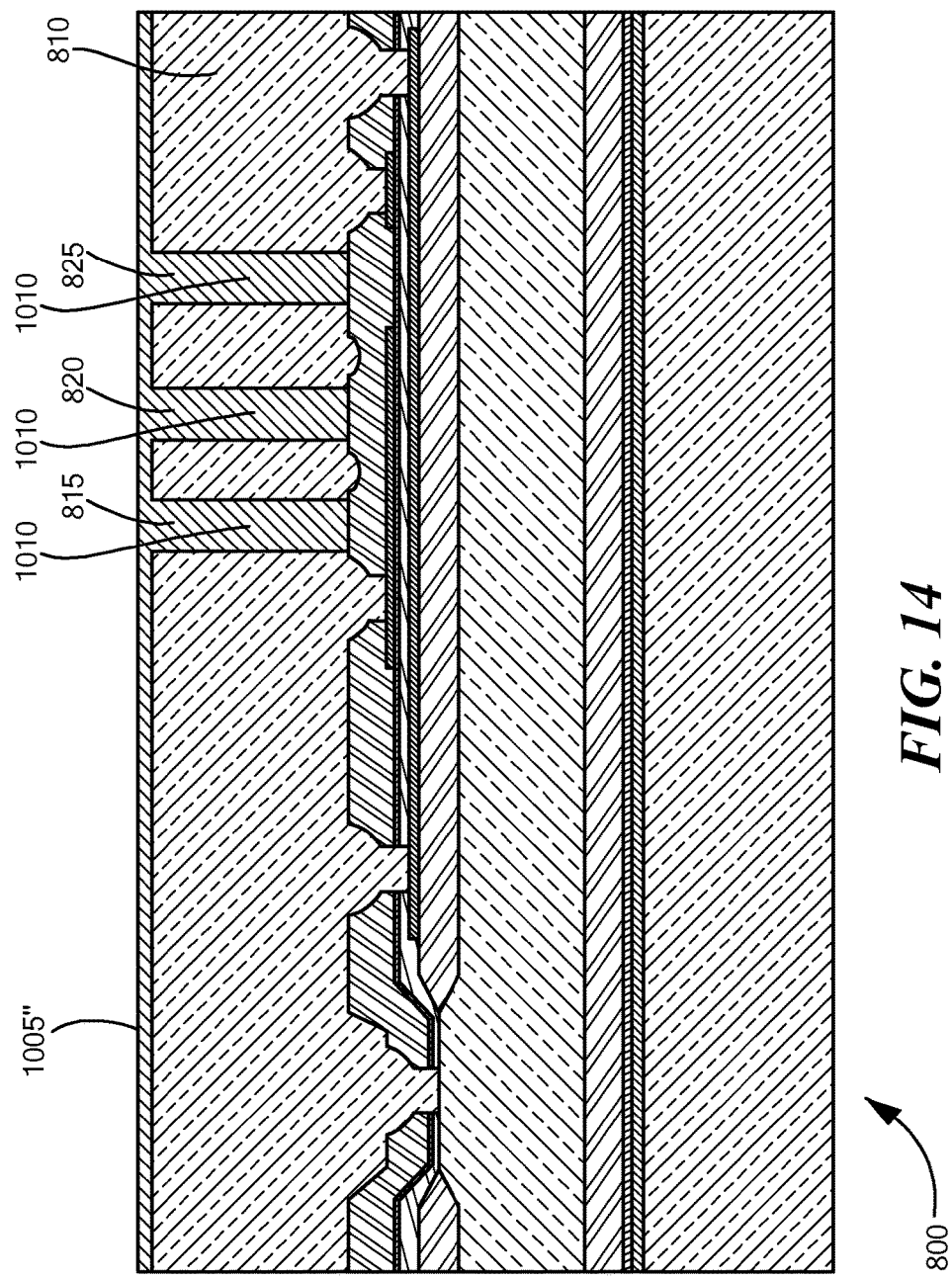
Figure 15:
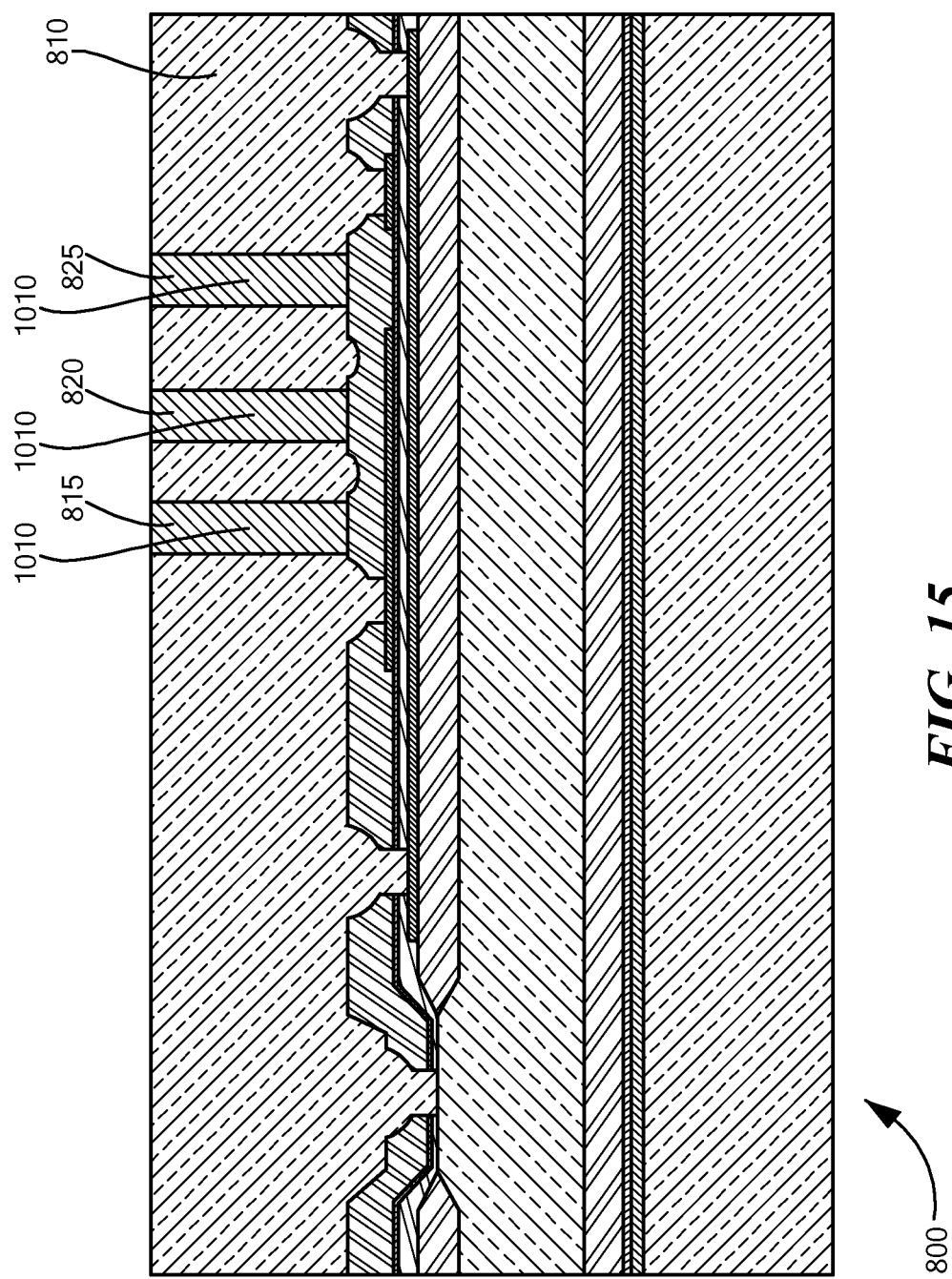

After the surface substance 1005 is removed, another layer of the substance is deposited over the MEMS sensor element 800, according to any of the methods described herein or that would have been appreciated by one of ordinary skill in the art. As depicted in FIG. 12, the second deposition step increases the thickness of the layer of substance 1010 deposited in the wells 815, 820, 825, whereas also depositing a layer 1005' on the surface of the silicon layer 810. Then, the same procedure for removing the surface substance 1005' is applied, producing a cleared silicon layer 810 and wells 815, 820, 825 that contain more of the substance 1110 (FIG. 14). In this embodiment, an additional deposition step is sufficient to fill the wells 815, 820, 825 entirely, as depicted in FIG. 14, and after the newest layer 1005" of surface substance is removed, the wells 815, 820, 825 may be filled to a comparable level as the surface of the silicon layer 810, as depicted in FIG. 15. In some embodiments, chemical mechanical polishing (CMP) may be used to make the contents 1010 of the wells 815, 820, 825 even with the silicon layer 810.

Figure 16:
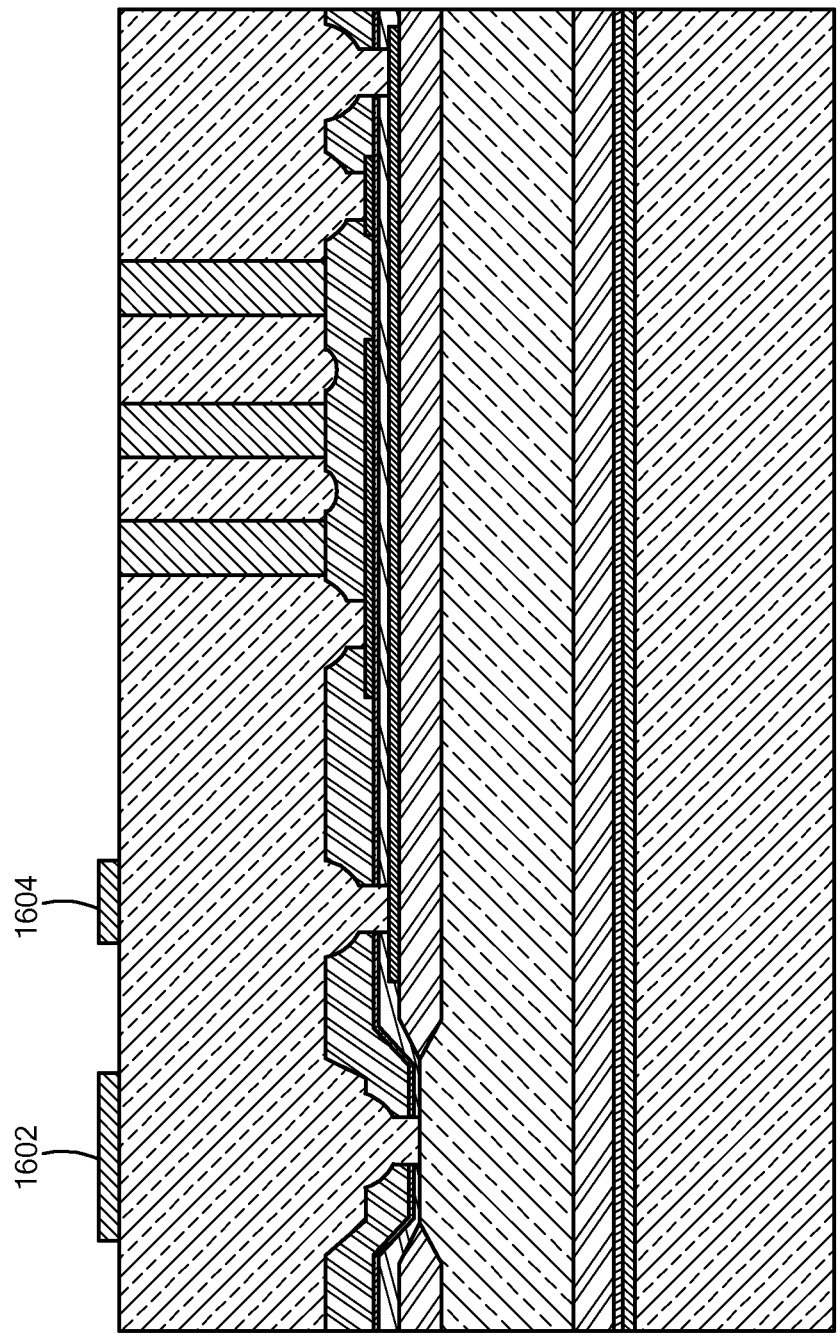
Figure 17:
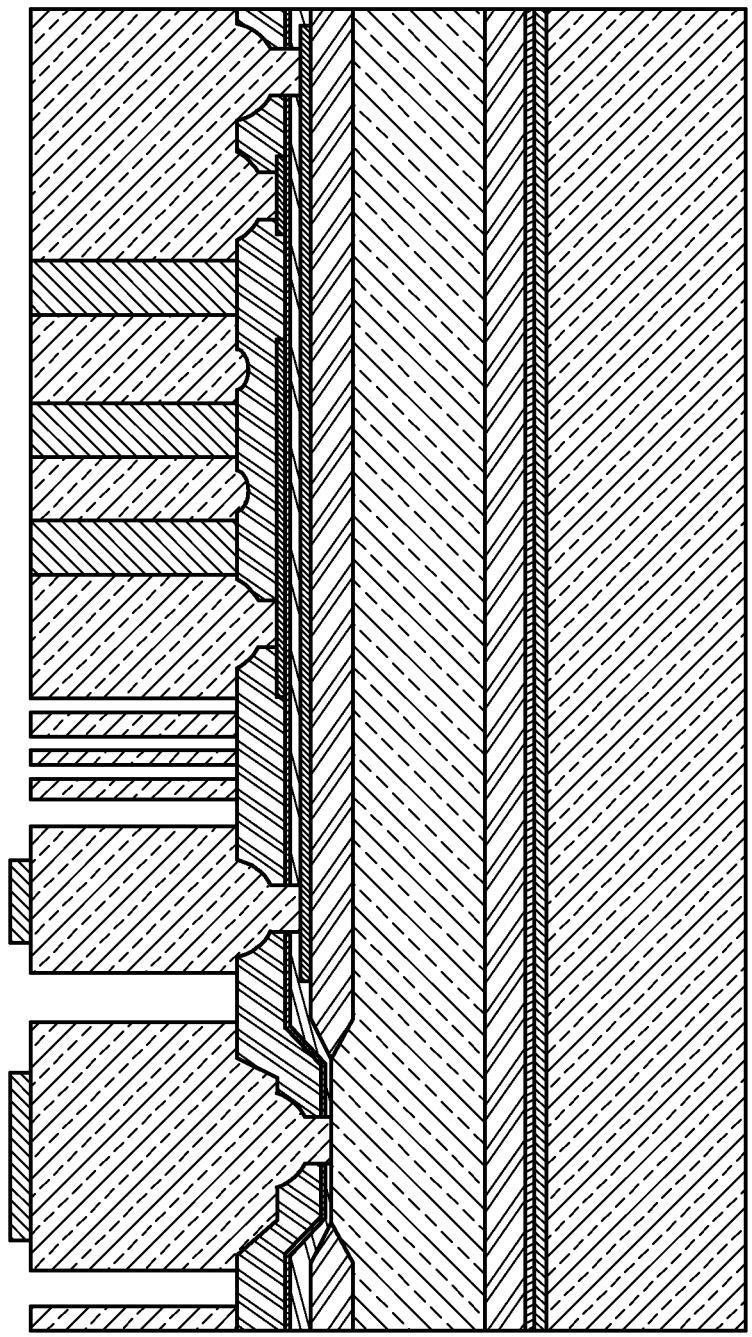
Figure 18:
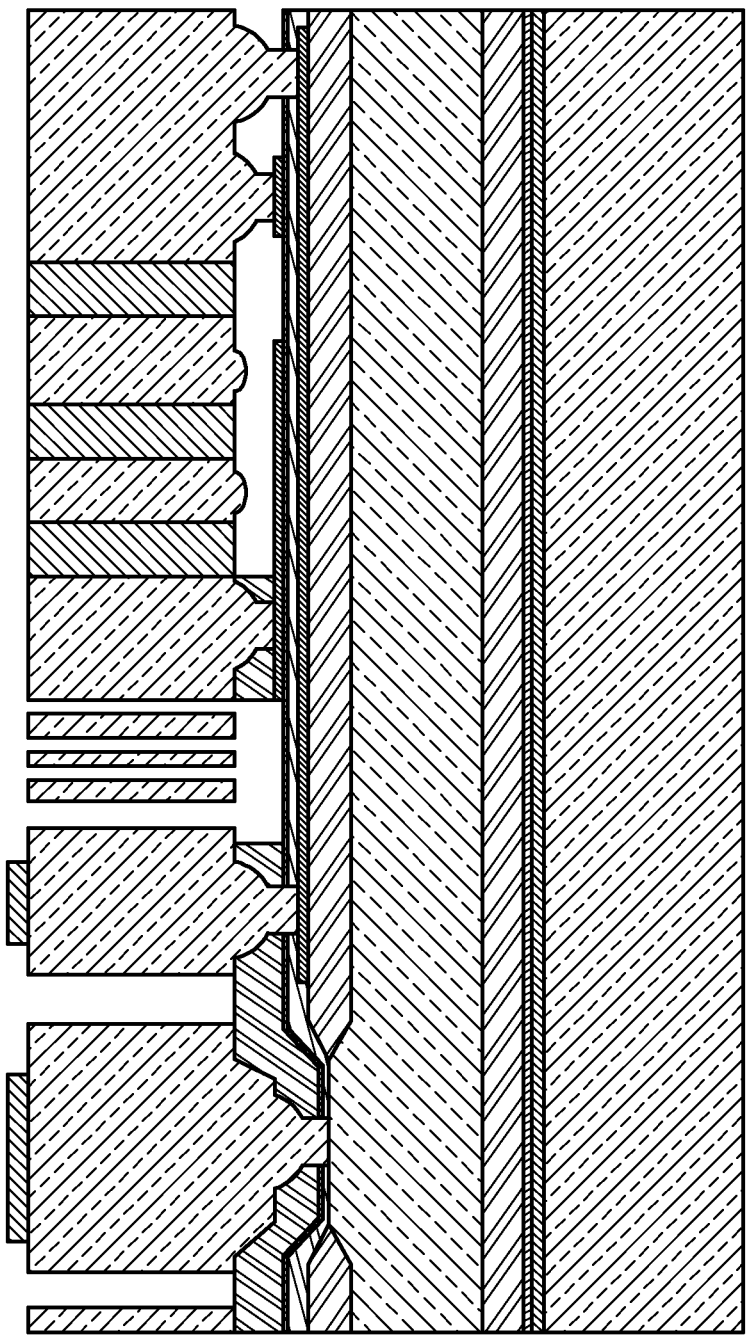
Figure 19:
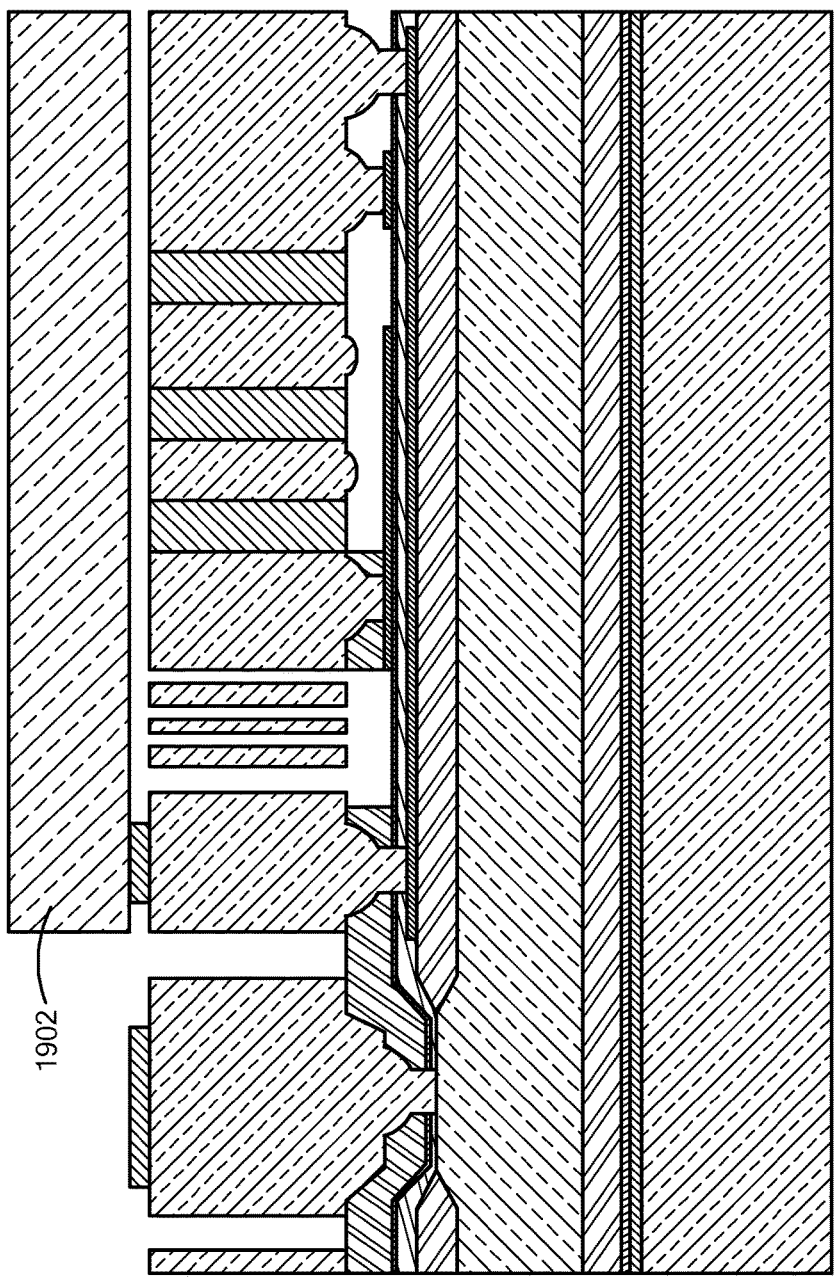
Figure 20:
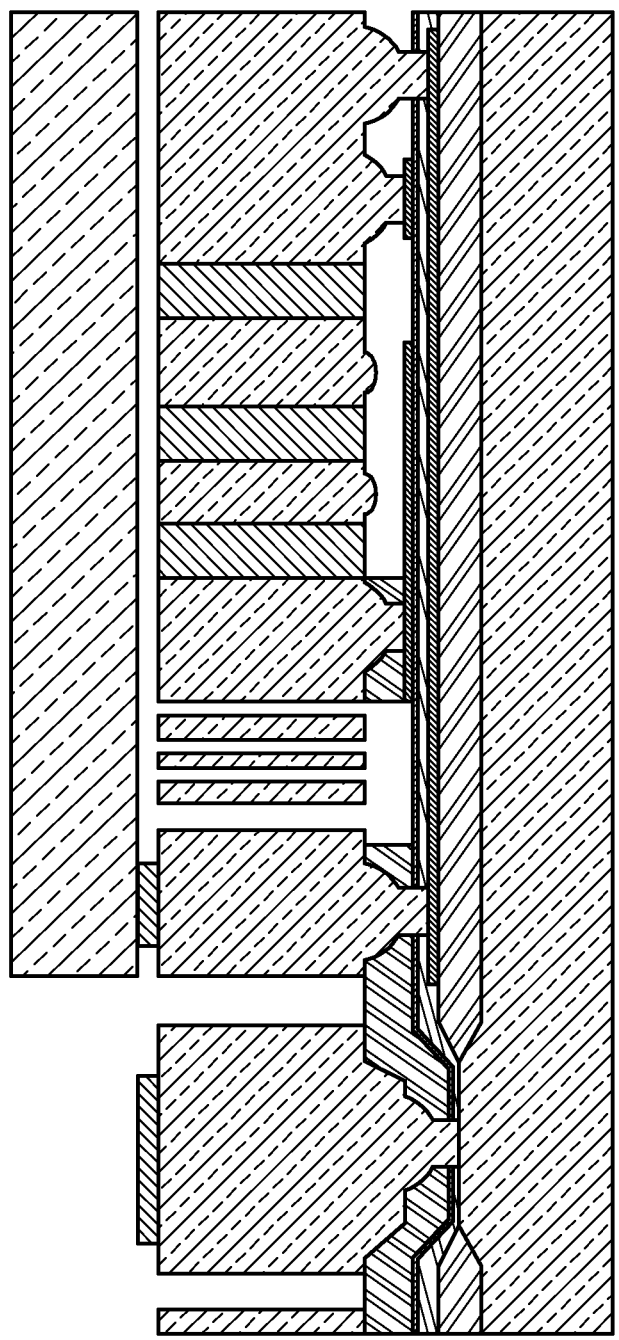

FIGS. 16-20 show some additional exemplary steps for completing the MEMS device, in accordance with one exemplary embodiment. In FIG. 16, a metal layer (e.g., aluminum) is deposited and then etched to form one or more bond pads 1602 and/or a seal ring 1604 for metal-to-metal bonding of a cap wafer. In FIG. 17, MEMS springs and finger gaps are etched. In FIG. 18, various MEMS structures are released by etching away underlying sacrificial oxide, e.g., using vapor or aqueous HF etching. In FIG. 19, the MEMS wafer is capped with a cap wafer by metal-to-metal bonding followed by grinding open the cap area above the bond pad(s). In FIG. 20, the MEMS wafer is ground from the back side to a desired thickness.

The embodiments of the invention described above are intended to be merely exemplary; numerous variations and modifications will be apparent to those skilled in the art. All such variations and modifications are intended to be within the scope of the present invention as defined in any appended claims.

What is claimed is:

1. A MEMS device comprising:
   a silicon-based movable MEMS sensor element having a surface with a plurality of wells formed therein;
   wherein the plurality of wells are filled with at least one metal and cover between 20% and 82% of the surface of the movable MEMS sensor element.

2. The MEMS device of claim 1, wherein the at least one metal includes tungsten or an alloy with tungsten.

3. The MEMS device of claim 1, wherein the at least one metal includes tantalum or an alloy with tantalum.

4. The MEMS device of claim 1, wherein the at least one metal is between about 20% and about 70% tungsten or tantalum or an alloy with tungsten or tantalum.

5. The MEMS device of claim 1, wherein the plurality of wells filled with at least one metal increase an effective mass of the movable MEMS sensor element between about 2.5× and about 7.0×.

6. The MEMS device of claim 1, wherein at least one well of the plurality of wells is shaped like a clover in a plane parallel to the surface.

7. The MEMS device of claim 6, wherein a length of an edge in the clover is about 6.4 μm and the wells are separated by about 2.0 μm.

8. The MEMS device of claim 1, wherein at least one well of the plurality of wells is shaped like a square in a plane parallel to the surface.

9. The MEMS device of claim 8, wherein each side in the square is between about 2.0 μm and about 10.0 μm and the wells are separated by about 2.0 μm.

10. The MEMS device of claim 1, wherein at least one well of the plurality of wells is shaped like a rectangle in a plane parallel to the surface.

11. The MEMS device of claim 10, wherein the rectangle has a length of about 20.0 μm, has a width of about 2.0 μm, and the wells are separated by about 6.0 μm.

12. The MEMS device of claim 1, wherein at least one well of the plurality of wells is shaped like a circle in a plane parallel to the surface.

13. The MEMS device of claim 12, wherein the circle has a diameter between about 2.0 μm and about 10.0 μm and the wells are separated by about 2.0 μm.

14. The MEMS device of claim 1, wherein at least one of:
   the movable MEMS sensor element is a proof mass of a MEMS accelerometer; or
   the movable MEMS sensor element is a resonator mass of a MEMS gyroscope.

15. The MEMS device of claim 1, wherein at least one well of the plurality of wells extends completely through the MEMS sensor element.

16. The MEMS device of claim 15, wherein multiple wells of the plurality of wells extend completely through the MEMS sensor element.

17. The MEMS device of claim 15, wherein at least one well of the plurality of wells extends only partially through the MEMS sensor element.

18. The MEMS device of claim 1, wherein at least one well of the plurality of wells is partially filled with the at least one metal.

19. The MEMS device of claim 1, wherein at least one well of the plurality of wells is completely filled with the at least one metal.

20. A method of fabricating a MEMS device, the method comprising:

forming a silicon-based MEMS sensor element having a surface;

forming a plurality of wells in the surface of the MEMS sensor element, wherein the plurality of wells covers between 20% and 82% of the surface; and filling the plurality of wells with at least one metal.

21. The method of claim 20, wherein the at least one metal includes tungsten or tantalum or an alloy with tungsten or tantalum.

22. The method of claim 20, wherein the wells are shaped like at least one of clovers, squares, rectangles, or circles.

23. The method of claim 20, wherein forming the plurality of wells comprises forming at least one well extending completely through the MEMS sensor element.

24. The method of claim 23, wherein forming the plurality of wells comprises forming a plurality of wells extending completely through the MEMS sensor element.

25. The method of claim 23, wherein forming the plurality of wells comprises forming at least one well extending only partially through the MEMS sensor element.

26. The method of claim 20, wherein filling the plurality of wells with at least one metal comprises partially filling at least one well of the plurality of wells with the at least one metal.

27. The method of claim 20, wherein filling the plurality of wells with at least one metal comprises completely filling at least one well of the plurality of wells with the at least one metal.

28. The method of claim 20, further comprising releasing the MEMS sensor element after filling the plurality of wells with at least one metal.

* * * * *